US006208176B1

United States Patent
Schroeder et al.

(10) Patent No.: US 6,208,176 B1
(45) Date of Patent: Mar. 27, 2001

(54) ADAPTIVE DRIVER CIRCUIT FOR SEMICONDUCTOR MAGNETORESISTORS

(75) Inventors: Thaddeus Schroeder, Rochester Hills; Joseph Pierre Heremans, Troy, both of MI (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 09/156,139

(22) Filed: Sep. 17, 1998

(51) Int. Cl.$^7$ ........................................ H03K 3/00
(52) U.S. Cl. .............................. 327/108; 327/510
(58) Field of Search .......................... 327/108, 110, 327/510; 323/315; 360/66

(56) References Cited

U.S. PATENT DOCUMENTS

| | | | |
|---|---|---|---|
| 5,168,244 | * 12/1992 | Muranaka | 330/257 |
| 5,402,064 | * 3/1995 | Eck et al. | 327/510 |
| 5,404,102 | 4/1995 | Gokhale et al. | 324/252 |
| 5,570,016 | 10/1996 | Schroeder et al. | 324/207.25 |
| 5,754,042 | 5/1998 | Schroeder et al. | 324/207.25 |
| 5,986,839 | * 11/1999 | Klaassen et al. | 360/66 |

OTHER PUBLICATIONS

C.J.Savanr,Jr., Martin S. Roden, Gordon L. Carpenter, "Electronic Design Circuits and Systems"Second Edition, 1991, p. 387 (9.3.4 Current Mirrors).
Horowitz et al, "The Art of Electronics", 2nd Edition 1989, Cambridge University Press, pp. 88–89.

* cited by examiner

Primary Examiner—Toan Tran
(74) Attorney, Agent, or Firm—Margaret A. Dobrowitsky

(57) ABSTRACT

An adaptive driver circuit which uses a modified conventional current mirror circuit to provide a current source employing an automatically adjustable current to compensate for decreased SMR device sensitivity at higher temperatures and large air gaps without the need for an active feedback circuit. The adaptive driver circuit according to the present invention is a unique modification of a current mirror circuit in that an SMR device is used as the reference resistor and a fixed resistor in the mirrored circuit to generate an output voltage. A modification is also possible whereby two adaptive driver circuits are used in a differential mode.

5 Claims, 2 Drawing Sheets

ABAPTIVE DRIVER CIRCUIT FOR
SEMICONDUCTOR MAGNETORESISTORS

ADAPTIVE DRIVER CIRCUIT FOR SEMICONDUCTOR MAGNETORESISTORS

TECHNICAL FIELD

The present invention relates to semiconductor magnetoresistive (SMR) devices, also known in the art as magnetoresistors (MR), employed in position and speed sensors, and more particularly to a method and apparatus to achieve increased sensitivity of SMR devices at high temperatures and large air gaps.

BACKGROUND OF THE INVENTION

It is well known in the art that the resistance modulation of SMR devices can be employed in position and speed sensors with respect to moving ferromagnetic materials or objects (see for example U.S. Pat. Nos. 4,835,467, 4,926,122, and 4,939,456).

The shortcoming of SMR devices is their temperature sensitivity. They have a negative temperature coefficient of resistance and their resistance can drop as much as 50% when heated to 180 degrees Celsius. Generally, this led to the use of SMR devices in matched pairs for temperature compensation. Additionally, it is preferable to drive SMR devices with current sources since, with the same available power supply, the output signal is nearly doubled in comparison with a constant voltage source.

To compensate for the SMR resistance drop at higher temperatures, and thus, the magnitude decrease of the output signal resulting in decreased sensitivity of the SMR device, it is also desirable to make the current of the current source automatically increase with the SMR temperature increase. This is shown in U.S. Pat. No. 5,404,102 in which an active feedback circuit automatically adjusts the current of the current source in response to temperature variations of the SMR device. It is also known that air gap variations between the SMR device and ferromagnetic materials or objects will affect the resistance of SMR devices with larger air gaps producing less resistance and decreased output signals.

What is needed is a less complicated method and apparatus having the features of a current source and employing an automatically adjustable current to compensate for decreased SMR sensitivity at high temperatures and large air gaps.

A circuit of interest in this regard, well known in the art, is a conventional current mirror circuit 10 (often referred to simply as a current mirror), shown in FIG. 1. In current mirror circuit 10, the reference resistor R has a fixed value and, in conjunction with the constant voltage source $V_{SS}$ and transistor $Q_1$, determines the magnitude of the reference current $I_R$. The electronic operation of the current mirror circuit 10 dictates that the current $I_O$ will have approximately the same magnitude as the reference current $I_R$ provided that transistors $Q_1$ and $Q_2$ are matched. Thus, the reference current $I_R$ is mirrored to be the collector current $I_O$ of transistor $Q_2$. In FIG. 1, $I_O$ is conventionally called the mirror current or mirrored current and the "mirrored portion" of the current mirror circuit 10 will be designated the mirrored circuit 12.

Accordingly, it would be desirable if somehow the current mirroring feature of a mirror circuit could be adapted to provide a current source employing an automatically adjustable current to compensate for decreased SMR device sensitivity at higher temperatures and large air gaps without the need for an active feedback circuit.

SUMMARY OF THE INVENTION

The present invention is an adaptive driver circuit which uses a modified conventional current mirror circuit, as shown in FIG. 1, to provide a current source employing an automatically adjustable current to compensate for decreased SMR device sensitivity at higher temperatures and large air gaps without the need for an active feedback circuit. The adaptive driver circuit according to the present invention is a unique modification of the current mirror circuit 10 of FIG. 1, in that an SMR device is used as the reference resistor and a fixed resistor in the mirrored circuit 12 of FIG. 1 to generate an output voltage.

In operation of the adaptive driver circuit according to the present invention, as the resistance of the SMR device decreases due to temperature increases or air gap increases between the SMR device and ferromagnetic materials or objects, the reference current increases. This produces an increase in the mirror current which increases the value of the output voltage across the fixed resistor, thereby maintaining the peak of the output voltage close to a known fixed saturation voltage. This offers a simple fixed threshold approach in converting the output signal into a digital signal.

A modification of the present invention is also possible whereby two adaptive driver circuits are used in a differential mode.

Accordingly, it is an object of the present invention to provide an output voltage having a peak value close to a known fixed saturation voltage.

It is an additional object of the present invention to provide an output voltage having a peak value close to a known fixed saturation voltage as the resistance of an SMR device change due to temperature variations of the SMR device.

It is still another object of the present invention to provide an output voltage having a peak value close to a known fixed saturation voltage as the resistance of an SMR device changes due to air gap variations between the SMR device and ferromagnetic materials or objects.

It is yet another object of the present invention to provide an output voltage representing a differential signal voltage between SMR devices.

These, and additional objects, advantages, features, and benefits of the present invention will become apparent from the following specification.

DESCRIPTION OF THE PREFERRED EMBODIMENT

Figure 2:
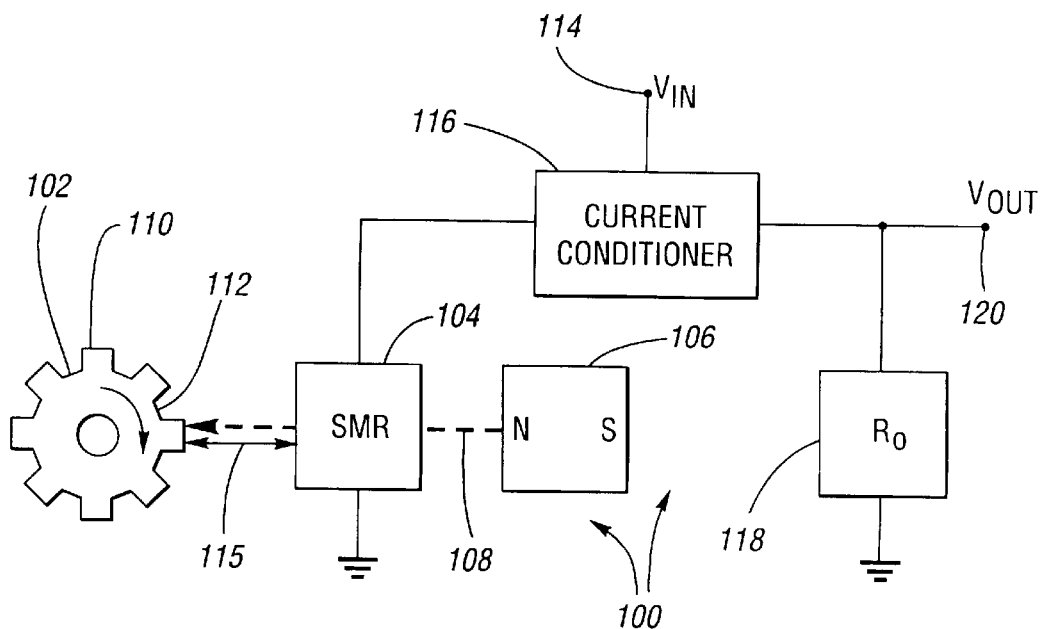
FIG. 2 depicts an example of the preferred environment of use of the present invention.
Figure 3A:
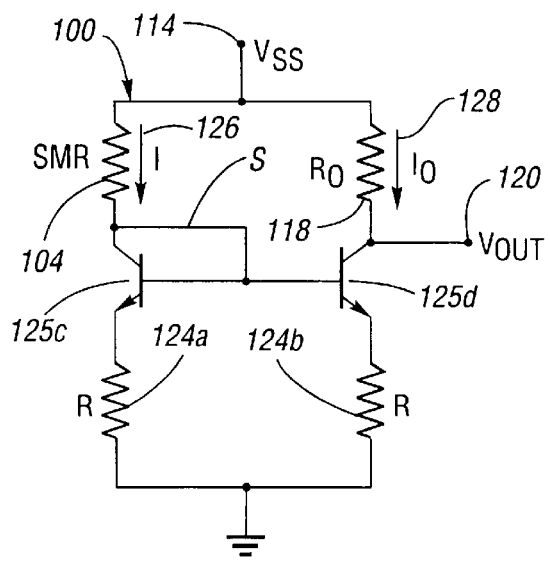
FIG. 3A shows the preferred embodiment of the present invention, wherein a NPN transistor is used.
Figure 3:
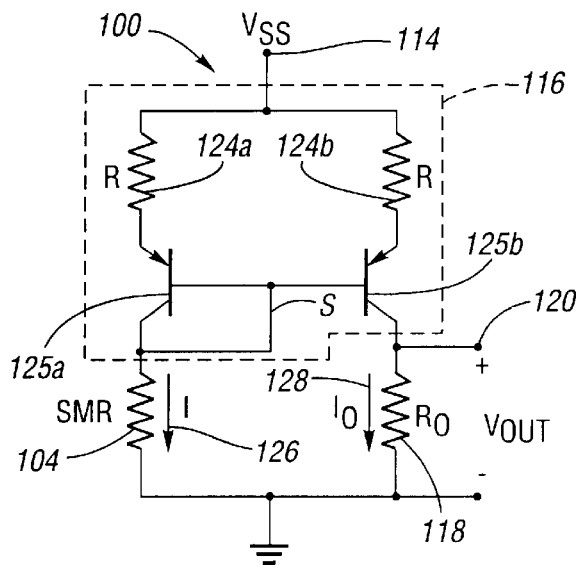
FIG. 3 shows the preferred embodiment of the present invention, wherein a PNP transistor is used.
Figure 4:
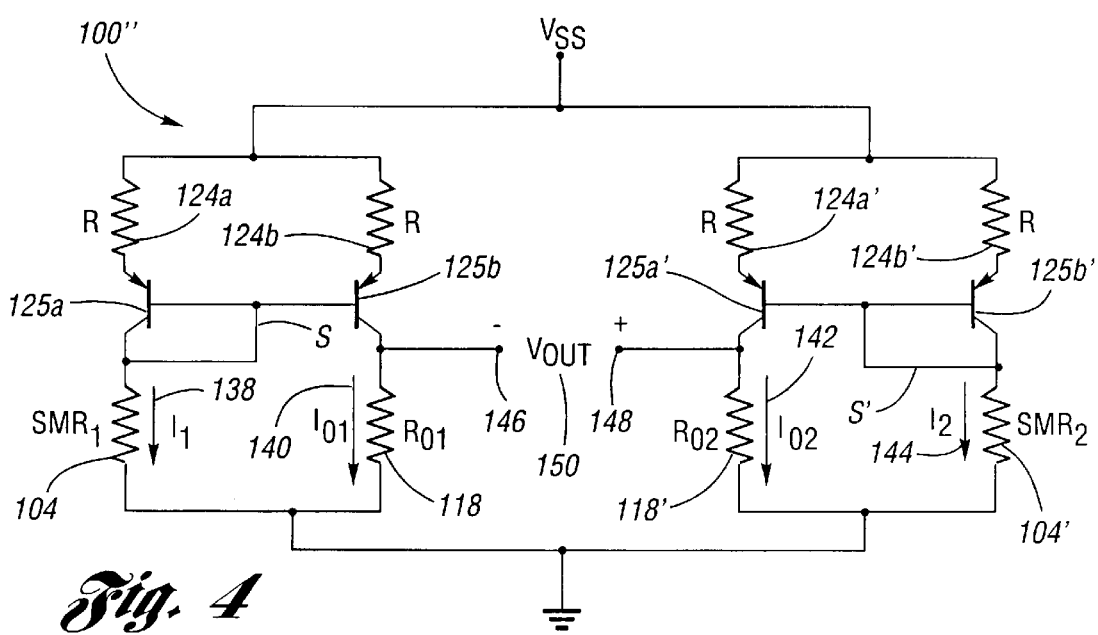
FIG. 4 shows an alternative embodiment of the present invention.

Referring now to the Drawing, FIGS. 2 through 4 depict the adaptive driver circuit 100 according to the present invention.

FIG. 2 is a schematic representation of an exemplar automotive environment of using of the adaptive driver circuit 100 according to the present invention, wherein a sensor wheel 102 is rotating, such as for example in unison with a crankshaft, a drive shaft or a cam shaft, and the rotative movement thereof is to be sensed. Rotative movement of the sensor wheel 102 is sensed using an SMR device 104, which is biased by a permanent magnet 106, wherein the magnetic flux 108 emanating therefrom is represented by the dashed arrow. The magnetic flux 108 passes from the permanent magnet 106, through the SMR device, and through an air gap 115 to the sensor wheel 102. The sensor wheel 102 is made of a ferromagnetic material typically, but not restrictively, toothed, having teeth 110 and slots 112 therebetween. The sensor wheel 102 is located near the SMR device 104 as indicated in FIG. 2.

A constant voltage source 114, a current conditioner 116, the SMR device 104, and a resistance ($R_O$) 118, represent a modified conventional current mirror according to the present invention. The output voltage ($V_{out}$) 120 is developed across resistor ($R_O$) 118. It is to be understood that all voltages are measured with respect to ground unless otherwise indicated herein. The current through the SMR device 104 is a function of its resistance, which can vary due to a variety of parameters. Typical parameters that can vary resistance of the SMR device 104 can be attributed to, but not limited by, variations in the air gap 115 between the SMR device and the sensor wheel 102 due to variations in the distance between the teeth 110 and the SMR device, and/or variations in the distance between the bottom of the slots 112 and the SMR device, and/or variations in the air gap as a result of irregular rotation of the sensor wheel, and/or temperature variations of the SMR device.

Figure 1:
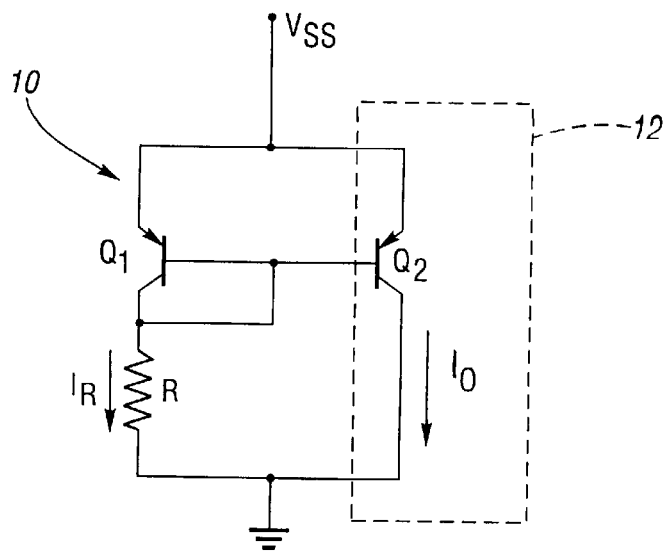
FIG. 1 shows a circuit schematic of a conventional current mirror.

FIG. 3 depicts the preferred embodiment of the adaptive driver circuit 100 according to the present invention, which is a modified conventional current mirror circuit (see current mirror circuit 10 at FIG. 1).

The current conditioner 116 of FIG. 2 is represented by a dashed block 116 in FIG. 3. The resistors (R) 124a, 124b have the same resistance value and are preferred to be present in order to serve as a limit for variations of the output voltage ($V_{out}$) 120 from a predetermined fixed saturation voltage; however these resistors may alternatively be replaced by respective short circuits, if desired. Electrical power for the adaptive driver circuit 100 is supplied by a constant voltage source ($V_{SS}$) 114.

The adaptive driver circuit 100 uniquely modifies a conventional current mirror circuit by using the SMR device 104 as a current reference resistor and a fixed resistor ($R_O$) 118 to generate the output voltage ($V_{out}$) 120. The resistance of the SMR device 104 determines the current (I) 126 which is mirrored as mirror current ($I_O$) 128. If the resistance of the SMR device 104 decreases due to an increase in the air gap 115 or due to an increase in the temperature of the SMR device, the current (I) 126 will increase, causing an increase in the mirror current ($I_O$) 128. This increase in the mirror current ($I_O$) 128 boosts the magnitude of the output voltage ($V_{out}$) 120 so as to thereby maintain the peak of the output voltage ($V_{out}$) close to a predetermined fixed saturation voltage which, in turn, offers a simple fixed threshold approach in converting the output voltage ($V_{out}$) into a digital signal. The variation in resistance of the SMR device 104 due to air gap variation from a tooth to a slot 112 or from a slot to a tooth produced by rotation of the sensor wheel 102, is sufficient enough such that a threshold can be set at approximately the midpoint between the peak and valley values of the output voltage which corresponds to, respectively, the tooth and the slot. The resistance value of the fixed resistor ($R_O$) 118 cannot exceed the minimum resistance value of the SMR device 104, for transistor biasing reasons. Accordingly, fixed resistor ($R_O$) 118 can be selected to have a negative temperature coefficient of resistance smaller, however, than that of the SMR device 104 so as to always satisfy the condition $(R_O)_{min} < (SMR)_{min}$ where $(SMR)_{min}$ represents the minimum resistance of the SMR device in a particular application.

FIG. 4 depicts an alternative embodiment of an adaptive driver circuit 100", wherein a twofold utilization of the adaptive driver circuit 100 of FIG. 3 is utilized. In FIG. 4, first and second SMR devices 104, 104'(designated respectively as $SMR_1$, and $SMR_2$)are matched SMR devices, wherein the first SMR device 104 ($SMR_1$) determines a current ($I_1$) 138 which is mirrored as a first mirror current ($I_{O1}$) 140 and the second SMR device 104' ($SMR_2$) determines a current ($I_2$) 142 which is mirrored as a second mirror current ($I_{O2}$) 144. In FIG. 4, the fixed resistors ($R_{O1}$) 118 and ($R_{O2}$) 118' are matched resistors having the same resistance value. Also in FIG. 4, the output voltage ($V_{out}$) 150 as measured between terminals 146 and 148, represents the differential voltage of fixed resistors ($R_{O2}$) 118" and ($R_{O1}$) 118, and is proportional to the differential voltage of the first and second SMR devices 104, 104'.

While the above embodiments of the adaptive circuit according to the present invention show usage of PNP transistors, it is within ordinary skill in the art to substitute NPN transistors for the PNP transistors, wherein routine adjustments of the embodiments of FIGS. 3 and 4 are made, as exemplified by FIG. 3A with respect to FIG. 3.

To those skilled in the art to which this invention appertains, the above described preferred embodiment may be subject to change or modification. Such change or modification can be carried out without departing from the scope of the invention, which is intended to be limited only by the scope of the appended claims.

What is claimed is:

1. An adaptive driver circuit for driving a semiconductor magnetoresistive device, said adaptive driver circuit comprising:

a first transistor having a first base, first emitter and first collector;

a second transistor having a second base, second emitter and second collector, wherein said first and second bases are mutually connected, and wherein said first transistor is matched to said second transistor;

a first semiconductor magnetoresistive device having a first end and a second end, said first end thereof being connected to said first collector;

a shunt connected between said first base and said first collector;

a first resistor having a first end and a second end, said first end thereof being connected to said second collector, wherein said second end of said second resistance is connected to said second end of said first semiconductor magnetoresistive device;

wherein a current through said first semiconductor magnetoresistive device is mirrored as an equivalent current through said first resistor;

a third transistor having a third base, third emitter and third collector;

a fourth transistor having a fourth base, fourth emitter and fourth collector, wherein said first, second, third and fourth emitters are mutually connected, wherein said third and fourth bases are mutually connected, and wherein said third transistor is matched to said fourth transistor;

a second semiconductor magnetoresistive device having a first end and a second end, said first end thereof being connected to said third collector;

a shunt connected between said third base and said third collector;

a second resistor having a first end and a second end, said first end thereof being connected to said fourth collector, wherein said second end of said second resistor is connected to said second end of said second semiconductor magnetoresistive device;

wherein a current through said second semiconductor magnetoresistive device is mirrored as an equivalent current through said second resistor; and wherein voltage outputs are provided, respectively, at said first end of said first and second resistors.

2. The adaptive driver circuit of claim 1, wherein said first, second, third and fourth emitters are mutually connected to a source of voltage; and wherein said second ends of said first and second resistors and said first and second semiconductor magnetoresistive devices are connected to ground.

3. The adaptive driver circuit of claim 2, further comprising a third resistor between said source of voltage and said first emitter; a fourth resistor between said source of voltage and said second emitter; a fifth resistor between said source of voltage and said third emitter; and a sixth resistor between said source of voltage and said fourth emitter.

4. The adaptive driver circuit of claim 1, wherein said first, second, third and fourth emitters are mutually connected to ground; and wherein said second ends of said first and second resistors and first and second said semiconductor magnetoresistive devices are connected to a source of voltage.

5. The adaptive driver circuit of claim 4, further comprising a third resistor between ground and said first emitter; a fourth resistor between ground and said second emitter; a fifth resistor between ground and said third emitter; and a sixth resistor between ground and said fourth emitter.

* * * * *